US007184334B2

(12) United States Patent
Watanabe et al.

(10) Patent No.: US 7,184,334 B2

(45) Date of Patent: Feb. 27, 2007

(54) SEMICONDUCTOR MEMORY DEVICE AND METHOD OF TESTING SEMICONDUCTOR MEMORY DEVICE

(75) Inventors: Masahiko Watanabe, Ando-cho Ikoma-gun (JP); Yasumichi Mori, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/051,346

(22) Filed: Feb. 4, 2005

(65) Prior Publication Data

US 2005/0174862 A1 Aug. 11, 2005

(30) Foreign Application Priority Data

Feb. 6, 2004 (JP) ............................ 2004-030621

(51) Int. Cl.
*G11C 29/00* (2006.01)
*G11C 7/00* (2006.01)

(52) U.S. Cl. .................. 365/201; 365/200; 365/230.03

(58) Field of Classification Search ..................... None
See application file for complete search history.

(56) References Cited

U.S. PATENT DOCUMENTS 4,855,621 A 8/1989 Hoffmann et al.
4,906,994 A 3/1990 Hoffmann et al.
5,293,386 A * 3/1994 Muhmenthaler et al. .... 714/718
5,307,316 A * 4/1994 Takemae .................... 365/200
5,355,342 A * 10/1994 Ueoka ........................ 365/201
5,392,246 A * 2/1995 Akiyama et al. ........... 365/200
5,689,463 A * 11/1997 Murakami et al. .......... 365/200
5,708,612 A 1/1998 Abe
5,848,018 A 12/1998 McClure
5,959,930 A * 9/1999 Sakurai ................. 365/230.03
6,072,719 A * 6/2000 Tanzawa et al. ....... 365/185.03
6,310,806 B1 * 10/2001 Higashi et al. ............. 365/200
6,643,175 B2 * 11/2003 Yamauchi et al. ..... 365/185.11
6,707,733 B2 * 3/2004 Taura et al. ................ 365/200
6,888,764 B2 * 5/2005 Shiga et al. ................ 365/200
2002/0118590 A1 8/2002 Furutani et al.
2003/0031049 A1 2/2003 Takashina et al.

FOREIGN PATENT DOCUMENTS

EP 0 708 451 B1 2/2002
EP 1 274 090 A1 1/2003
JP 8-106796 A2 4/1996
WO WO-02/057920 A2 7/2002
WO WO-02/057920 A3 7/2002

OTHER PUBLICATIONS

European Search Report mailed Jul. 4, 2005 for European Patent Application No. 05250629.2, 4 pages.

* cited by examiner

*Primary Examiner*—Son L. Mai
(74) *Attorney, Agent, or Firm*—Morrison & Foerster LLP

(57) ABSTRACT

A semiconductor memory device comprises at least one memory plane in which a plurality of memory blocks are arranged, and a block decoder circuit which decodes a block address signal for selecting the memory block from the memory plane and outputs block selection signals for selecting the memory block, as well as puts all of the block selection signals in a selected state and output them in a predetermined test mode, and a block selection signal inversion circuit which inverts or non-inverts signal levels of the block selection signals.

9 Claims, 10 Drawing Sheets

Plane Address

| Before Conversion | | After Conversion |
|---|---|---|
| 011 | → | 110 |
| 010 | → | 111 |
| 001 | → | 100 |
| 000 | → | 101 |

| Before Conversion | | After Conversion |
|---|---|---|
| 111 | → | 010 |
| 110 | → | 011 |
| 101 | → | 000 |
| 100 | → | 001 |

Block Address

| Before Conversion | | After Conversion |
|---|---|---|
| 11 | → | 01 |
| 10 | → | 00 |
| 01 | → | 11 |
| 00 | → | 10 |

FIG. 6

SEMICONDUCTOR MEMORY DEVICE AND METHOD OF TESTING SEMICONDUCTOR MEMORY DEVICE

CROSS REFERENCE TO RELATED APPLICATION

This Nonprovisional application claims priority under 35 U.S.C. §119(a) on patent application Ser. No. 2004-030621 filed in Japan on Feb. 6, 2004, the entire contents of which are hereby incorporated by reference.

BACKGROUND OF THE INVENTION

1. Field of the Invention

The present invention relates to a semiconductor memory device and a method of testing a plurality of memory blocks in the semiconductor memory device and, more particularly, it relates to method of testing a plurality of memory blocks in a nonvolatile semiconductor memory device.

2. Description of the Related Art

In addition to a normal operation test performed by the unit of a memory cell in a semiconductor memory device, there is a stress applying test in which an electric stress is applied to all of the memory cells in order to secure their reliability.

In a nonvolatile semiconductor memory device, particularly, it is necessary to guarantee that the characteristics of programming or erasing of all of the memory cells and data retaining characteristics are normal. For example, there is a method to attain the above guarantee by applying an electric stress (an overvoltage or an overcurrent) to all of the memory cells for a certain period of time (stress applying time) in a stress applying test and comparing the characteristics before and after the test.

In the stress applying test, it is necessary to apply the stress to all of the memory cells (in which each terminal of the memory cell is set at a certain potential in order to apply the electric stress to the memory cell) for a certain period of time. A manufacturing cost (testing cost after manufacturing process, especially) can be lowered by applying the stress to the plurality of memory cells at the same time in order to shorten the total stress applying time in the stress applying test.

Meanwhile, there is a defective memory cell which does not operate normally because of a defect in s semiconductor substrate or particles generated during the manufacturing process in the semiconductor memory device. Therefore, if a perfectly good-quality product in which all memory cells operate normally is employed only, since the manufacturing yield is lowered, in general, there is a method of performing redundancy assist for the defective memory cell at the time of the test.

As redundancy assist technique in general, there is a method in which a defective row or a defective column containing a defective memory cell in a memory cell array, or a defective row or a defective column which is entirely defective is replaced with a redundant row or a redundant column, which are previously provided in the peripheral part of the memory cell array by the predetermined number. In this case, a defective row address and a defective column address are stored in defective address storing means and an address inputted from the outside is compared with stored defective row address and defective column address, and when they coincide with each other, the redundant row or the redundant column is automatically selected.

Although the above mentioned method is effective for a defective mode generated by the memory cell or along the row direction or the column direction, it is not so effective in a case many bits are continuously defective (in which the plurality of defective memory cells are continuously generated) caused by the particles, because the row or the column which can be assisted is limited by the number of the redundant rows or the redundant columns and the defects are frequently generated as the manufacturing process becomes fine.

Thus, there is a block redundancy assisting method in which a memory block consisting of a plurality of memory cells is assisted as one unit. According to this block redundancy assisting method, the case where many bits are continuously defective caused by the particles and the like can be effectively assisted and the manufacturing yield can be improved.

However, the defective cause of the defective memory block is not solved and the defective memory block is simply not used. Thus, when the stress applying test is performed for the assisted product, if there is a serious interconnect short-circuit problem as its cause, the electric stress is not normally applied because of the defective cause and the other normal memory block to which the electric stress is applied at the same time is not normally tested.

In addition, although there is a process for putting all of the memory cells in an erased state once at the time of testing in the nonvolatile semiconductor memory device such as a flash memory, the same problem occurs in the case all memory cells are erased at the same time. That is, there is a problem in which an erasing voltage level is lowered because of the interconnect short-circuit and the like when the erasing voltage is applied to the defective memory block, so that other normal memory blocks are not normally erased. In addition, when the voltage is applied to the plurality of memory blocks similarly, the same problem occurs if the defective memory blocks are contained in the plurality of memory blocks.

In order to solve the above problems, there is a method conventionally such that a predetermined electric stress is applied to all memory blocks which do not contain the defective block, and the electric stress is applied to each memory block which may contain the defective block without applying the voltage to all of the memory blocks at the same time.

In addition, a semiconductor memory device disclosed in JP-A 08-106796 (1996) has a constitution in which a defective block which is replaced with a redundant block is not selected when all memory blocks are in a batch programmed/erased mode for a test.

However, there is the following problem in the conventional stress applying test and the batch programming/erasing process for the memory blocks containing the defective block. That is, when the process is performed for each of the memory block containing the defective block, the processing time is increased by the number of the memory blocks, which causes the manufacturing cost to be increased. Particularly, since the number of memory blocks is increased because capacity is increased and the manufacturing process becomes fine, the number of memory blocks containing the defective memory block is increased, so that the manufacturing cost is further increased.

In addition, according to the above constitution of the semiconductor memory device disclosed in JP-A 08-106796 (1996), it is necessary to store an address of the defective block to identify the defective block in order not to select the defective block replaced with the redundant block and a test before the block redundancy assisting process or the stress applying test cannot be performed for it. In addition, the constitution disclosed in JP-A 08-106796 (1996) does not premise the defective block in the stress applying test particularly.

SUMMARY OF THE INVENTION

The present invention has been made in view of the above problems and it is an object of the present invention to provide a semiconductor memory device and a method of testing the semiconductor memory device in which the above problems are solved, and when defective memory blocks are contained in a plurality of memory blocks, only the defective blocks are not selected easily and a predetermined test is performed for the plurality of memory blocks.

In order to achieve the above object, a semiconductor memory device according to a first aspect of the present invention comprises at least one memory plane in which a plurality of memory blocks comprising a plurality of memory cells in the form of an array are arranged. Herein, the semiconductor memory device comprises a block decoder circuit which decodes a block address signal for selecting the memory block from the memory plane and outputs block selection signals for selecting the memory blocks individually, and can output all of the block selection signals in a selected state or a non-selected state in a predetermined test mode, and a block selection signal inversion circuit which inverts or non-inverts a signal level of the block selection signals.

According to a second aspect of the present invention, in addition to the first aspect of the present invention, the semiconductor memory device comprises a plane control circuit which has the block decoder circuit input a block address of a defective block and perform the normal decoding process, and, controls the block selection signal inversion circuit to perform the inversion process when the defective block exists in the memory plane, and selects all of the memory blocks in the memory plane when the defective block does not exist in the memory plane, in the predetermined test mode.

According to a third aspect of the present invention, in addition to the second aspect of the present invention, the semiconductor memory device is designed such that the plane control circuit commands the block decoder circuit to output all of the block selection signals in the selected state, and the block selection signal inversion circuit to perform the non-inversion process, or commands the block decoder circuit to output all of the block selection signals in the non-selected state, and the block selection signal inversion circuit to perform the inversion process, when the defective block does not exist in the memory plane.

With the semiconductor memory device according to any one of the above aspects of the present invention, in the predetermined testing mode such as a stress applying test and the like, when the defective block is contained in the memory plane, the block address of the defective block is inputted to the block decoder circuit to perform the normal decoding operation, and the block selection signal inversion circuit inverts the signal level of the block selection signals, so that the block selection signal corresponding to the defective block becomes the non-selected state and the block selection signals corresponding to the other memory blocks become the selected state, in the memory plane containing the defective block. As a result, only the defective block can be in non-selected state. In this case, since the defective block address is only inputted to the block decoder circuit, even when the redundancy assist for the defective block is not performed yet, the plurality of memory blocks except for the defective block can be selected. As a result, the problems regarding the defective block in the stress applying test and the like performed for the plurality of memory blocks can be easily solved, and the plurality of memory blocks can be selected regardless of the process state of the redundancy assist for the defective block. In addition, when the defective block is not contained in the memory plane, all of the memory blocks can be selected like in the conventional example.

According to a fourth aspect of the present invention, in addition to the second or third aspect of the present invention, the semiconductor memory device comprises a memory array comprising the plurality of arranged memory planes, and a plane decoder circuit which decodes plane address signals for selecting the memory plane from the memory array and outputs plane selection signals for selecting the memory planes individually, and the plane control circuit selects all of the memory blocks in the memory plane which is not selected by the plane selection signal in the predetermined test mode.

With the semiconductor memory device according to the fourth aspect of the present invention, the plurality of memory blocks can be selected in the semiconductor memory device comprising the plurality of memory planes similar to the case of the first to third aspects of the present invention.

According to a fifth aspect of the present invention, in addition to any one of the above aspects of the present invention, the semiconductor memory device comprises a redundant block having the same number of memory cells and the same constitution as in the memory block, and an address conversion circuit which performs an internal address replacement operation in which at least a defective block address is replaced with a redundant block address of the redundant block in order to replace a defective block with the redundant block when one memory block in the memory plane is the defective block, and the block decoder circuit receives the block address after converted in the address conversion circuit as an input.

Furthermore, with the semiconductor memory device according to the fifth aspect of the present invention, the defective block can be assisted such that the defective bock is replaced with the redundant block. In addition, even in the semiconductor memory device after the block redundancy assist is performed, if the redundant block address is inputted to the address conversion circuit, the defective bock address is inputted to the block decoder circuit, so that the plurality of memory blocks can be selected similar to the case of the first to third aspects of the present invention.

In order to achieve the above object, according to a first aspect of the present invention, a method of testing a semiconductor memory device comprising at least one memory plane in which a plurality of memory blocks comprising a plurality of memory cells in the form of an array are arranged comprises a determination step of determining whether there is a defective memory block in the memory plane or not, a first block selection step of inputting a defective block address of the defective memory block as a block address for selecting the memory block from the memory plane, inverting all decoding signals of the defective block address to be supplied to the memory plane containing the defective memory block, and selecting all of the memory blocks except for the defective memory block, when it is determined that the defective memory block exists in the determination step, and an application step of applying a predetermined stress or voltage at the same time to all of the selected memory blocks in the memory plane.

According to a second aspect of the present invention, in addition to the first aspect of the present invention, the method of testing the semiconductor memory device according to the present invention comprises a second block selection step of supplying all decoding signals of the block address in the selected state to the memory plane and selecting all of the memory blocks when it is determined that the defective memory block does not exist in the determination step.

With the method of testing the semiconductor memory device according to the first or second aspect of the present invention, in a predetermined testing mode such as a stress applying test and the like, when the defective block is contained in the memory plane, the block address of the defective block is inputted, and the signal level of the decoded signals is inverted, so that the decode signal corresponding to the defective block becomes the non-selected state and the decode signal corresponding to the other memory blocks become the selected state, in the memory plane containing the defective block. As a result, only the defective block can be in the non-selected state. In this case, since the defective block address is only inputted for the decoding process, even when the redundancy assist for the defective block is not performed yet, the plurality of memory blocks except for the defective block can be selected to which a predetermined stress or voltage can be applied. As a result, the problems regarding the defective block in the stress applying test and the like performed for the plurality of memory blocks can be easily solved, and the plurality of memory blocks except for the defective block can be selected and applied with a stress of voltage regardless of the process state of the redundancy assist for the defective block. In addition, when the defective block is not contained in the memory plane, all of the memory blocks can be selected like in the conventional example.

In order to achieve the above object of the present invention, according to a third aspect of the present invention, a method of testing a semiconductor memory device comprising a plurality of memory planes in which a plurality of memory blocks comprising a plurality of memory cells in the form of an array are arranged comprises a determination step of determining whether there is a defective memory block in the plurality of memory planes, a first plane selection step of inputting a defective plane address of the memory plane containing the defective memory block as a plane address for selecting the memory plane, putting the memory plane containing the defective memory block in a selected state and putting other memory planes in a non-selected state, when it is determined that the defective memory block exists in the determination step, a third block selection step of inputting the defective block address of the defective memory block as a block address for selecting the memory block from the memory plane, inverting all decoding signals of the defective block address to be supplied, selecting all of the memory blocks except for the defective memory block in the memory plane which is selected in the first plane selection step, and selecting all of the memory blocks in the memory plane which is not selected in the first plane selection step, when it is determined that the defective memory block exists in the determination step, and an application step of applying a predetermined stress or voltage to all of the selected memory blocks in the plurality of memory planes at the same time.

According to a fourth aspect of the present invention, in addition to the third aspect of the present invention, the method of testing the semiconductor memory device comprises a second plane selection step of inputting an arbitrary plane address as a plane address for selecting the memory plane, putting one of the plurality of memory planes in the selected state, and putting other memory planes in the non-selected state when it is determined that the defective memory block does not exist in the determination step, and a fourth block selection step of supplying all decoding signals of the block address in the selected state to the memory plane which is selected in the second plane selection step to select all of the memory blocks, and selecting all of the memory blocks in the memory plane which is not selected by the second plane selection step, when it is determined that the defective memory block does not exist in the determination step.

With the method of testing the semiconductor memory device according to the third or fourth aspect of the present invention, the operation for selecting the plurality of memory blocks and the applying operation can be performed to the semiconductor memory device comprising the plurality of memory planes similar to the case of the first or second aspect of the present invention.

BRIEF DESCRIPTION OF THE DRAWINGS

FIG. 6 is an address conversion table showing concrete examples of an address conversion process according to one embodiment of the nonvolatile semiconductor memory device in the present invention;

DESCRIPTION OF PREFERRED EMBODIMENTS

An embodiment of a semiconductor memory device and its testing method according to the present invention (referred to as "inventive device" and "inventive method" occasionally, hereinafter) will be described with reference to the accompanying drawings. The description will be made under the assumption that the inventive device is a boot block-type flash memory.

According to the inventive device, a functional block constitution in a normal operation mode in the entire device is the same as the conventional general boot block-type flash memory, so that respective detailed descriptions for functional blocks (for example, an address input circuit, an address decoder circuit, a data input/output circuit, a data programming/erasing circuit, a peripheral circuit such as a control circuit for controlling readout and programming operations of data) will be omitted, and characteristic circuit constitution and procedures of the inventive device and the inventive method, respectively, will be described hereinafter.

Figure 1:
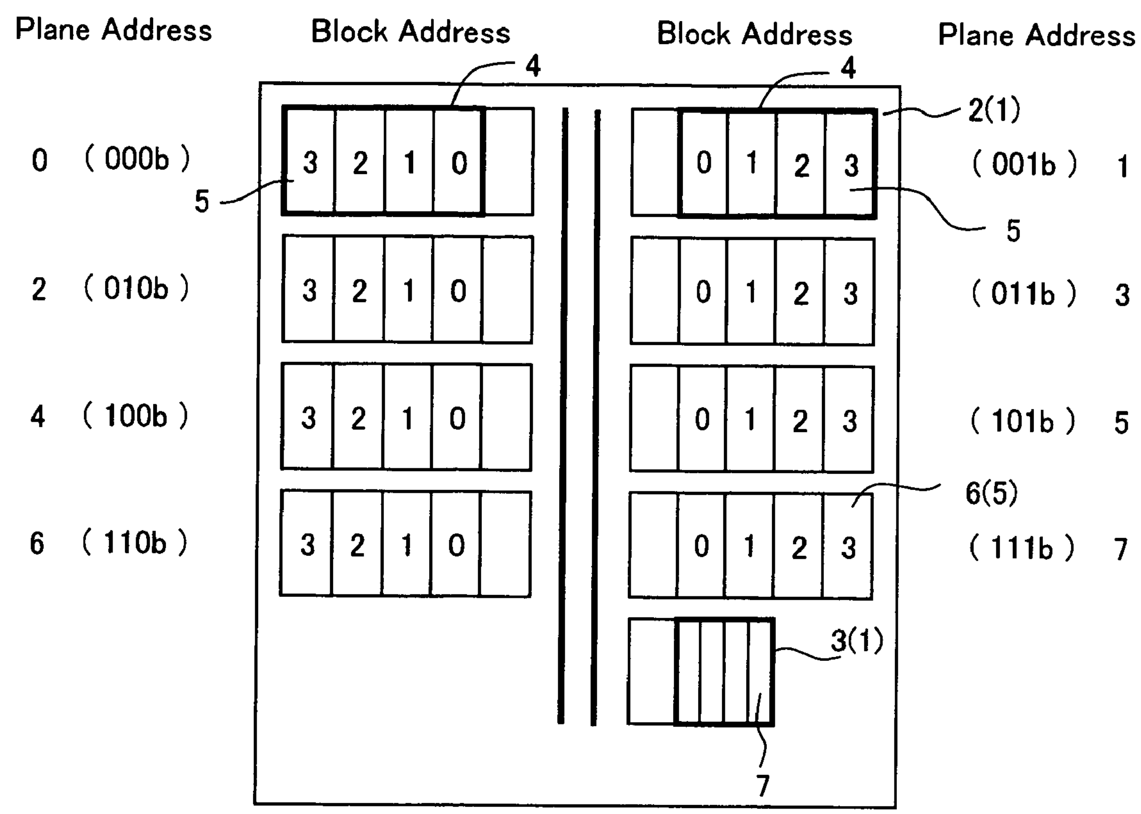
FIG. 1 is a block diagram schematically showing a memory array constitution according to one embodiment of a nonvolatile semiconductor memory device in the present invention.

FIG. 1 shows a memory array constitution of the inventive device schematically. According to this embodiment, a memory array 1 is divided into a memory array body part 2 and a boot block part 3. The memory array body part 2 is evenly divided into a plurality of memory planes 4 (eight memory planes in FIG. 1), and each memory plane 4 is evenly divided into four memory blocks 5. Each memory block 5 is so constituted that memory cells are arranged in the form of an array. According to this embodiment, a flash cell comprising a flash memory transistor having a floating gate structure is assumed as a memory cell, and each memory block 5 is a unit of data erasing.

According to the block constitution shown in FIG. 1, since the total number of the memory blocks in the memory array body part 2 is 32, a block address for selecting one memory block from the memory array, body part 2 consists of 5 bits. Among the above address bits, it is assumed that higher 3 bits is a plane address for selecting the memory plane and lower 2 bits is a block address for selecting one of four memory blocks 5 in each memory plane 4. The lower 2 bits of the block address is referred to as a block address unless otherwise noted hereinafter. In addition, the number of divided memory planes of the memory array body part 2 and the number of divided blocks in each memory plane 4 are one example and the present invention is not limited to this embodiment.

According to this embodiment, a most significant block address (11111) is for a particular block address and a memory block corresponding to the particular block address is set as a redundant block 6. In addition, the boot block part 3 (corresponding to the particular memory block) provided apart from the memory array body part 2 is allocated to the same particular block address. As will be described below, when the particular block address "11111" is inputted from the outside, it is constituted such that the redundant block 6 is not selected but the boot block part 3 is selected. That is, the memory plane physically comprising the redundant block is so constituted that it logically comprises the boot block. The detailed description will be made of the circuit constitution later.

Although the total number of memory cells in the boot block part 3 is the same as that of the memory block 5 of the memory array body part 2, the boot block part 3 is further divided into a plurality of small memory blocks 7 and data can be erased by the small memory block. Since it is necessary to separate the small memory blocks 7 from each other in the boot block part 3, its area becomes larger than that of the memory block 5 in the memory array body part 2. Therefore, if the memory array body part 2 comprises the boot block part 3, extra space is needed in the memory array body part 2. However, according to this embodiment, that problem is appropriately avoided.

Figure 2:
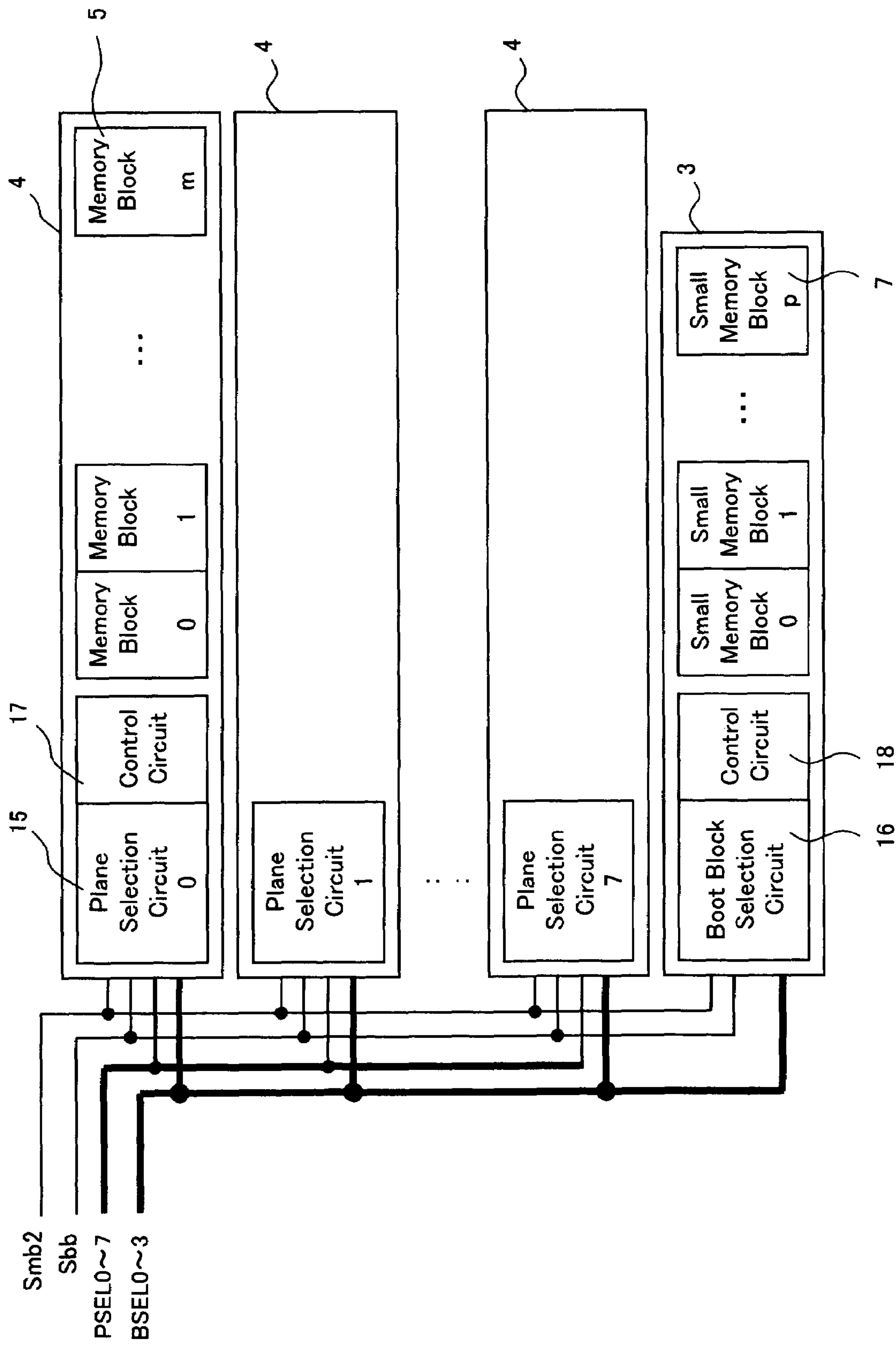
FIG. 2 is another block diagram schematically showing a memory array constitution according to one embodiment of the nonvolatile semiconductor memory device in the present invention.

Referring to FIG. 1, four memory planes 4 are arranged each on the right and left sides and signal lines (such as an address signal, a data signal and various control signals) required for memory operations (such as data reading, data programming, data erasing and the like) are arranged in the center of the memory array body part 2. In FIG. 1, a circuit for selecting the memory plane 4 and control circuits required for the memory operations (such as various kinds of a decoder circuit, a readout circuit, a programming/erasing circuit and the like) are arranged on the center side of each memory plane 4. More specifically, they are arranged as shown in FIG. 2. Referring FIG. 2, there is provided a hierarchical bit line structure in which a global bit line is arranged so as to go across the plurality of memory blocks from side to side, a local bit line is provided for each memory block in the column direction (in the horizontal direction in FIG. 2), drain electrodes of flash cells in the same column in each memory block are connected to a common local bit line, and the local bit line is connected to the global bit line through a predetermined bit line selection transistor. According to this constitution, various kinds of memory operations from a control circuit 17 can be performed for the selected memory cell through each bit line. In addition, word lines (not shown) are provided in the row direction (vertical direction in FIG. 2), gate electrodes of the flash cells in the same row in each memory block are connected to the common word line and the memory cells can be selected in the row direction by the selected word line. The boot block part 3 has the constitution similar to that of the memory plane 4 basically, and a control circuit 18 for the memory operations similar to the memory plane 4 is provided.

Next, a description will be made of a block replacement process according to the inventive method in which when one of the memory blocks 5 (block addresses are "00000" to "11110") in the memory array body part 2 is a defective block which needs assist of the redundant block, the defective memory block is replaced with the redundant block 6 of the redundant block address "11111".

Figure 3:
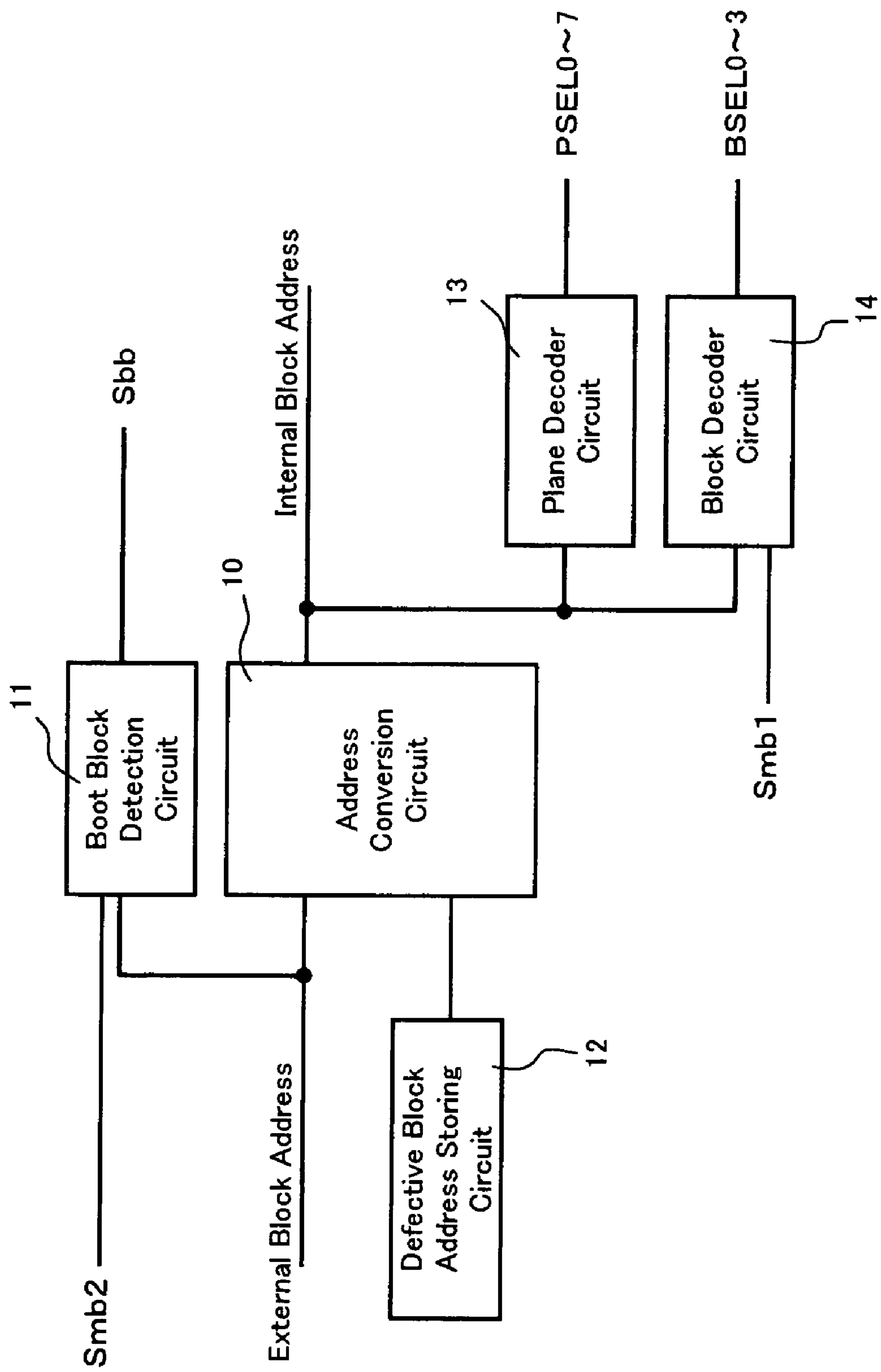
FIG. 3 is a block diagram showing a circuit constitution regarding a process for selecting a plurality of blocks and a block replacement process according to one embodiment of the nonvolatile semiconductor memory device in the present invention.

First, a circuit constitution regarding the block replacement process will be described. As shown in FIG. 3, an external block address inputted from the outside is inputted to an address conversion circuit 10 and a boot block detection circuit 11 (corresponding to a particular block address detection circuit). The boot block detection circuit 11 outputs a boot block selection signal Sbb at a predetermined signal level (high level, for example) when the external block address is the particular block address, that is, the most significant address "11111".

The address conversion circuit 10 converts the external block address to the internal block address by inverting the inputted external block address bit of which a part of a 5 bits of defective block address outputted from a defective address storing circuit 12 in which a state (1 or 0) of each address bit of the defective block address is stored does not coincide with the redundant block address (11111), and outputs it.

The higher 3 bits of the plane address in the internal block address converted by the address conversion circuit 10 is inputted to a plane decoder circuit 13 and eight plane selection signals PSEL0 to 7 are outputted from the plane decoder circuit 13. One of the plane selection signals PSEL0 to 7 outputs a predetermined selection level (high level, for example) depending on a value of the plane address, and other seven signals output a non-selection level (low level, for example). The lower 2 bits of the block address in the internal block address is inputted to a block decoder circuit 14 and four block selection signals BSEL0 to 3 are outputted from the block decoder circuit 14.

As shown in FIG. 2, the boot block selection signal Sbb generated in the boot block detection circuit 11, the plane selection signals PSEL0 to 7 generated in the plane decoder circuit 13, the block selection signals BSEL0 to 3 generated in the block decoder circuit 14 are inputted to a plane selection circuit 15 in each memory plane and a boot block selection circuit 16. In addition, only one of the plane selection signals PSEL0 to 7 is inputted to the corresponding plane selection circuit 15. When the boot block selection signal Sbb is at a high level, all of the plane selection circuits 15 are in a non-selected state regardless of the states of the plan selection signals PSEL0 to 7, and the boot block selection signal Sbb is energized to become a selected state.

Next, a description will be made of a circuit constitution for selecting all of the memory blocks 5 and the boot block part 3 except for the defective block which is contained in a certain memory plane by the inventive method.

As shown in FIG. 3, a first plural block selection signal Smb1, other than the block address, which transmits to a predetermined signal level (high level, for example) when the plurality of memory blocks 5 are selected in a predetermined test mode is inputted to the block decoder circuit 14. When the first plural block selection signal Smb1 transits to the predetermined level (high level), all of the signal levels of the block selection signals BSELO to 3 becomes the non-selected state (low level) in the block decoder circuit 14 regardless of the state of the block address.

In addition, a second plural block selection signal Smb2 is inputted to the boot block detection circuit 11 and when the second plural block selection signal Smb2 transits to a predetermined signal level (high level, for example), the boot block selection signal Sbb is put in a particular block address non-detected state (low level, for example) and outputted even at the time of input of the particular block address. Thus, the control which puts the memory array body part 2 in the non-selected state while the particular block address is inputted can be released.

As shown in FIG. 2, the second plural block selection signal Smb2 inputted to the boot block detection circuit 11 is inputted to the plane selection circuit 15 of each memory plane and the boot block selection circuit 16 other than the boot block selection signal Sbb, the plane selection signals PSEL0 to 7 and the block selection signals BSEL0 to 3.

Figure 4:
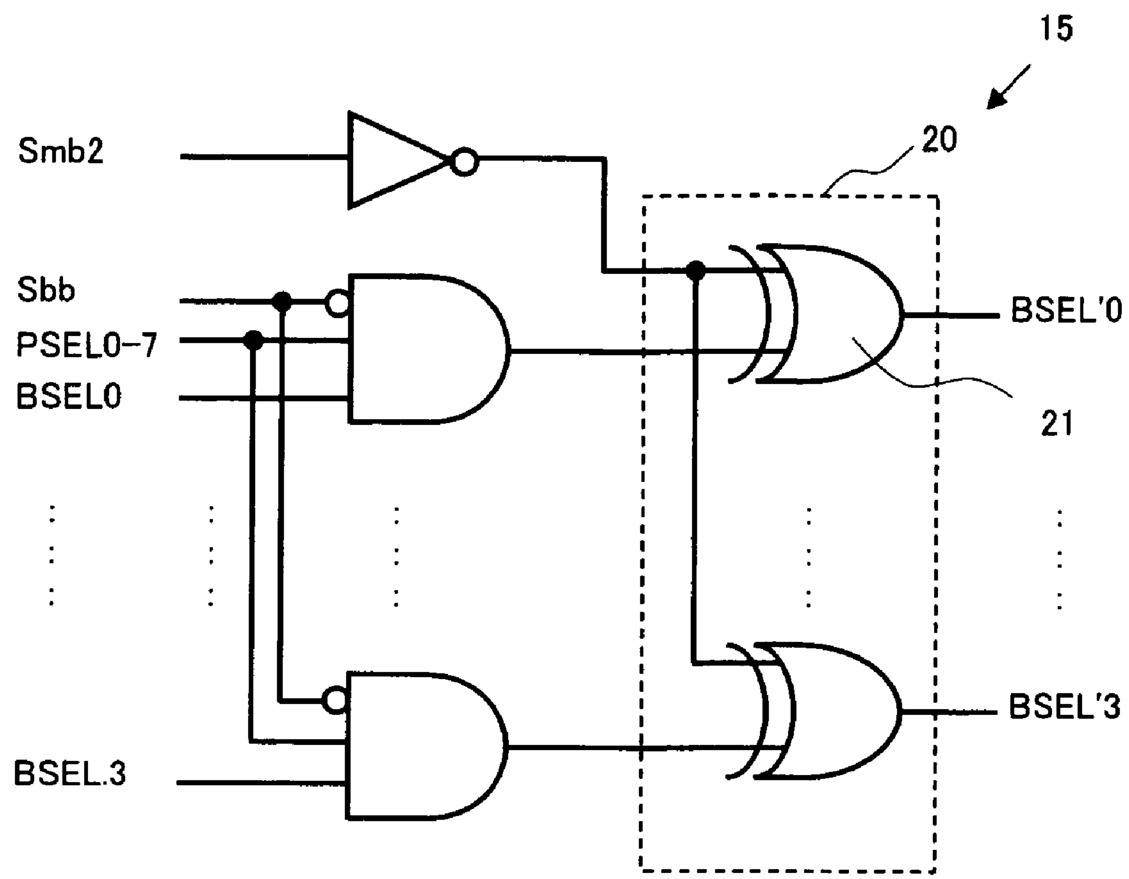
FIG. 4 is a logical circuit diagram showing a circuit constitution of a plane selection circuit regarding the process for selecting the plurality of blocks according to one embodiment of the nonvolatile semiconductor memory device in the present invention.

As shown in FIG. 4, a block selection signal inversion circuit 20 which internally inverts all of the inputted block selection signals BSEL0 to 3 when the second plural block selection signal Smb2 is at the predetermined signal level (high level) is provided in the plane selection circuit 15. In addition, the block selection signal inversion circuit 20 comprises an exclusive OR circuit 21 according to the embodiment shown in FIG. 4. In addition, as shown in FIG. 4, the plane selection circuit 15 is so constituted that when all of the inputted plane selection signal PSEL0 to 7 are in the non-selected state (low level), all of the inputted block selection signals BSEL0 to 3 are internally put in the non-selected state (low level) so as not to select the memory block in the non-selected memory plane in a normal memory operation, but when the second plural block selection signal Smb2 is at the predetermined signal level (high level), all of the inputted block selection signals BSEL0 to 3 are internally put in the selected state (high level) by the block selection signal inversion circuit 20. Each memory block of the memory plane is determined whether it is selected or not by the output signals BSEL'0 to 3 of the block selection signal inversion circuit 20.

In addition, the boot block selection signal Sbb and the second plural block selection signal Smb2 are inputted to the boot block selection circuit 16 of the boot block part 3 and when the second plural block selection signal Smb2 is at the high level, all of the small memory blocks in the boot block part 3 are put in the selected state.

Next, procedures for selecting the plurality of memory blocks at the same time will be described using the above circuit constitution of the block decoder circuit 14, the plane selection circuit 15 and the like.

For example, when it comes to be necessary to select the plurality of memory blocks at the same time in a stress applying test, in a batch erasure mode of all blocks and the like, a tester connected to the inventive device determines whether a defective block exists in any memory plane or not. The determination may be made by examining the contents of the operation test which has been performed or examining whether block assist exists or not when there is the block redundant assist as will be described below.

When the defective block exists, the first plural block selection signal Smb1 is brought to be the low level and the block decoder circuit 14 is set such that the normal decoding operation can be performed and the second plural block selection signal Smb2 is set at the high level. Then, the address corresponding to the defective block is inputted as the plane address and the block address from the outside. Here, it is assumed that a process for the block redundancy assist which will be described below is not performed and the address conversion circuit 10 outputs the inputted plane address and the block address as they are without converting them.

Therefore, the plan address and the block address of the defected block inputted from the outside are inputted to the plane decoder circuit 13 and the block decoder circuit 14 as they are. The decoder circuits 13 and 14 perform the decoding processes for the inputted addresses like the normal memory operations and output the plane selection signals PSEL0 to 7 and the block selection signals BSEL0 to 3. Here, one of the plane selection signals PSEL0 to 7 and one of the block selection signals BSEL0 to 3 corresponding to the defective block become the high level and others become the low level and inputted to each plane selection circuit 15.

Since a plane selection signal PSELi (it is assumed that “i” is the plane number containing the defective block) of the memory plane containing the defective block is at the high level, and the boot block selection signal Sbb is at the low level, the block selection signals BSEL0 to 3 are inputted to the block selection signal inversion circuit 20 as they are. Here, since the second plural block selection signal Smb2 is at the high level, the block selection signal inversion circuit 20 inverts the inputted block selection signals BSEL0 to 3 and outputs the inverted block selection signals BSEL'0 to 3. Therefore, the inverted block selection signal BSEL'j (it is assumed that “j” is the defective block number) corresponding to the defective block becomes the low level, the other inverted block selection signals BSEL' becomes the high level, so that all of the memory blocks except for the defective block are selected.

Meanwhile, since a plane selection signal PSELk (it is assumed that "k" is the plane number which does not contain the defective block, and "k" is not equal to "i") of the memory plane which does not contain the defective block is at the low level, and the boot block selection signal Sbb is at the low level, the block selection signals BSEL0 to 3 are all become the low level and inputted to the block selection signal inversion circuit 20. Here, since the second plural block selection signal Smb2 is at the high level, the block selection signal inversion circuit 20 inverts the inputted block selection signals BSEL0 to 3 and outputs the inverted block selection signals BSEL'0 to 3. Therefore, all of the inverted block selection signals BSEL'0 to 3 become the high level, and all of the memory blocks are selected.

In addition, since the second plural block selection signal Smb2 inputted to the boot block selection circuit 16 is at the high level, all of the small memory blocks in the boot block part 3 become the selected state.

As described above, all of the memory blocks containing the boot block part 3 except for the defective block are selected. Then, a predetermined electric stress or a voltage is applied to all of the selected memory blocks, so that a desired test can be performed on all of the selected memory blocks at the same time.

When it is determined that there is no defective block in any memory plane, the first plural block selection signal Smb1 is brought to be the high level and the signal levels of all of the block selection signals BSEL0 to 3 of the block decoder circuit 14 are put in the non-selected state (low level). In this case, the plane address and the block address inputted to the address conversion circuit 10 may be any address. The plane address and the block address from the outside are inputted to the plane decoder circuit 13 and the block decoder circuit 14 as they are. The plane decoder circuit 13 performs the decoding process for the inputted address like the normal memory operation and outputs the plane selection signals PSEL0 to 7. Meanwhile, the block decoder circuit 14 outputs the block selection signals BSEL0 to 3 which are all in the non-selected state (low level). Therefore, since the block selection signal BSEL0 to 3 which are all at the non-selected state (low level) are inputted to each plane selection circuit 15 of all of the memory planes, the block selection signals BSEL0 to 3 which are all at the low level are inputted to the block selection signal inversion circuits 20 regardless of the signal levels of the plane selection signals PSEL0 to 7 and the boot block selection signal Sbb. Here, since the second plural block selection signal Smb2 is at the high level, the block selection signal inversion circuit 20 inverts the inputted block selection signals BSEL0 to 3 and outputs the inverted block selection signals BSEL'0 to 3. Therefore, all of the inverted block selection signals BSEL' become the high level in all of the memory planes, and all of the memory blocks are selected. In addition, since the second plural block selection signal Smb2 inputted to the boot block selection circuit 16 is at the high level, all of the small memory blocks in the boot block part 3 become the selected state.

As described above, all of the memory blocks containing the boot block part 3 are selected. Then, the predetermined electric stress or voltage is applied to all of the selected memory blocks, so that a desired test can be performed on all of the selected memory blocks at the same time.

Next, a description will be made of a circuit constitution of the address conversion circuit 10, algorithm of an address conversion process and a method of selecting the memory block after the address conversion process.

Figure 5:
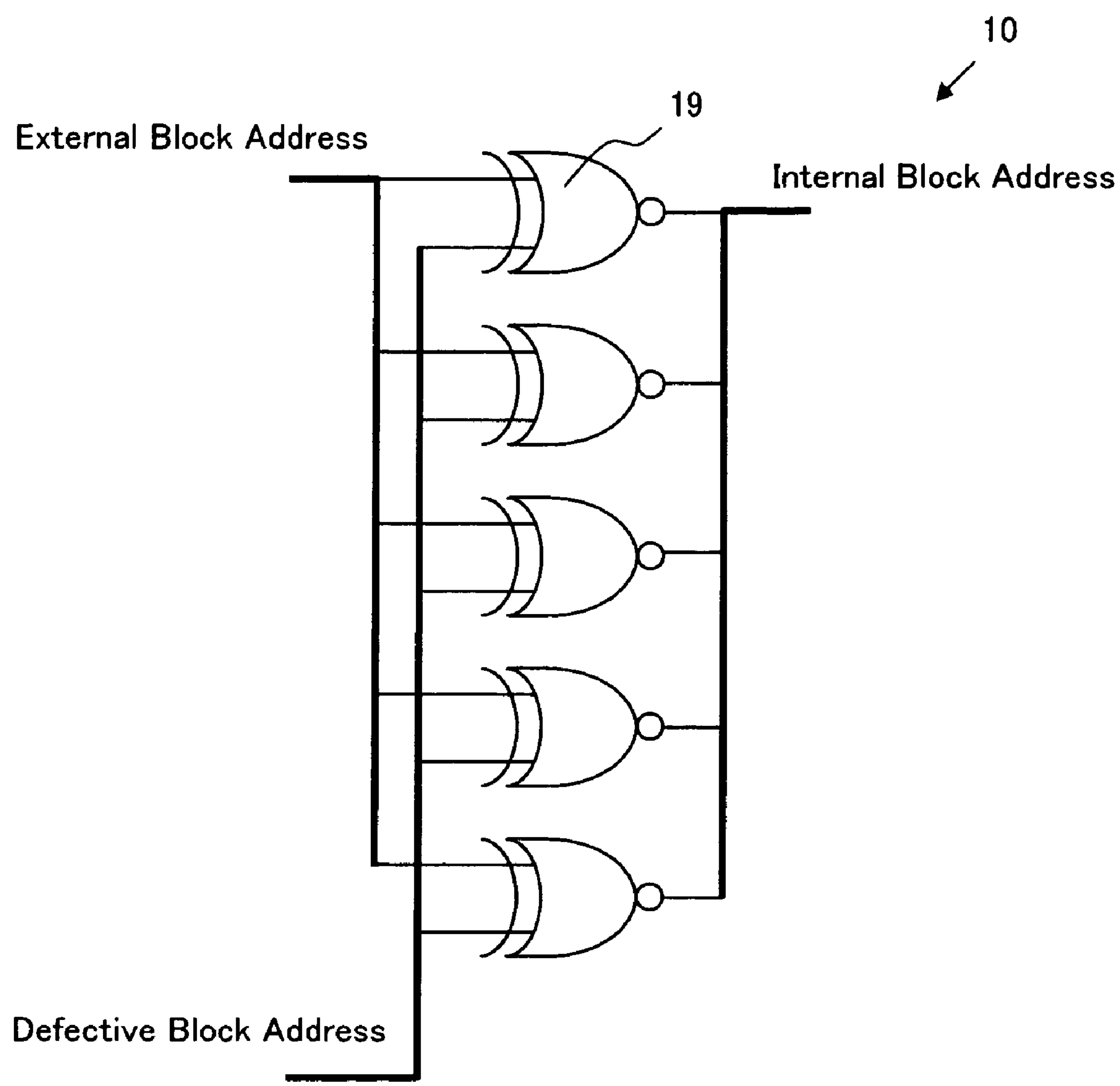
FIG. 5 is a logical circuit diagram showing an address conversion circuit according to one embodiment of the nonvolatile semiconductor memory device in the present invention.

As shown in FIG. 5, the address conversion circuit 10 comprises five 2-input exclusive NOR circuits 19 logically. Each address bit of the external block address and each address bit of a corresponding defective block address are inputted to each exclusive NOR circuit 19. According to the exclusive NOR process, when two inputted values (0 or 1) coincide with each other, "1" is outputted and when they do not coincide with each other, "0" is outputted. According to this embodiment, since the redundant block address is "11111", the position where the address bit of the defective block address is "0" does not coincide with the redundant block address. Therefore, the position where the address bit of the defective block address is "0" is inverted by the exclusive NOR process in each address bit of the external block address to be the internal block address. That is, when the address bit of the external block address is "1", "0" is outputted and when it is "0", "1" is outputted. On the contrary, the position where the address bit of the defective block address is "1" is not inverted and the address bit of the external block address is outputted as the address bit of the internal block address as it is.

For example, when the defective block address is "01001", the second, third, and fifth bits from the least significant bit of the defective block address are inverted, so that the internal block address becomes "11111". Therefore, when this defective block address "01001" is inputted to the address conversion circuit 10 as the external block address, the internal block address "11111" is outputted. Then, the internal block address "11111" is inputted to the plane decoder circuit 13 and the block decoder circuit 14 and the redundant block of the block 3 of the memory plane 7 is selected.

Then, the address conversion process by the exclusive NOR process for all of the block addresses will be examined. The higher 3 bits of plane address is separated from the lower 2 bits of block address to be described.

As shown in a conversion table in FIG. 6, the eight memory planes have pairs and the addresses thereof are converted to those of the pairs. Similarly, the four blocks in the memory plane 4 have pairs and the addresses thereof are converted to those of the pairs. It is determined which memory plane is paired and which block is paired by the defective block address. According to this embodiment, when the external block address A is converted to the internal block address B, the external block address B is converted to the internal block address A by the address conversion circuit 10, so that symmetric relation is provided between the external block address and the internal block address.

Figure 7:
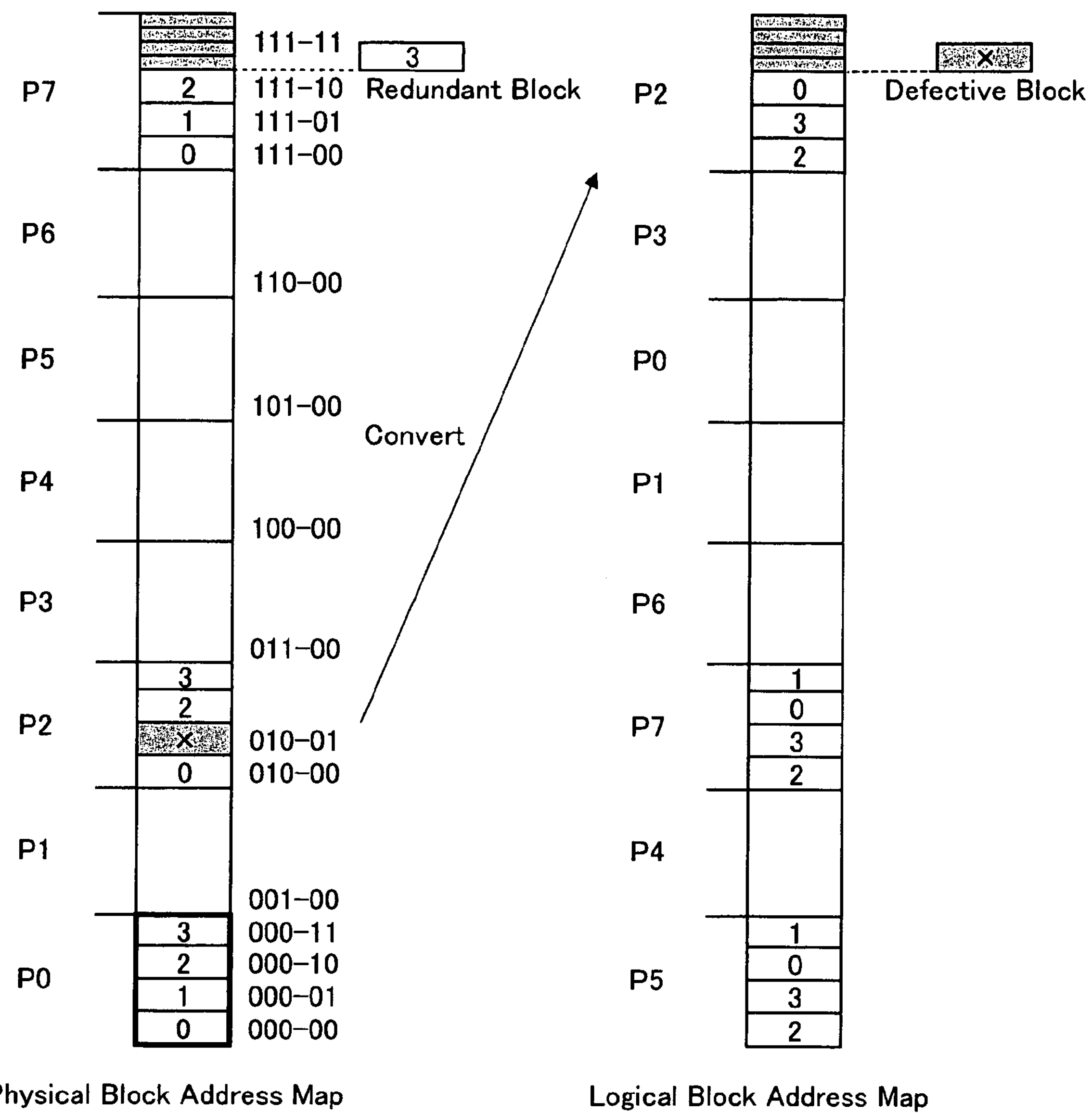
FIG. 7 is an address map showing concrete examples of the address conversion process according to one embodiment of the nonvolatile semiconductor memory device in the present invention.

Here, when the memory plane is converted, each memory plane is converted in a lump and the memory block is converted in the memory plane, so that the memory block in the same memory plane is moved in the same memory plane after it is converted, which is schematically shown in FIG. 7. In FIG. 7, a physical block address is treated as block address which physically corresponds to an actual position of each memory block in the memory array. In addition, a logical block address map in FIG. 7 shows a corresponding relation between the positions of the physical memory plane and memory block, and the converted logical block address, showing how the arrangement of the physical memory plane and memory block is logically changed by the address conversion process. The memory planes and the memory blocks in the same vertical position in the right and left block address maps are the same substances physically. An arrow in FIG. 7 shows that even when the physical block address "01001" showing the defective block is inputted as the external block address, since it is converted to the internal block address "11111" by the address conversion process, the redundant block positioned at the original physical block address "11111" is selected.

Figure 8:
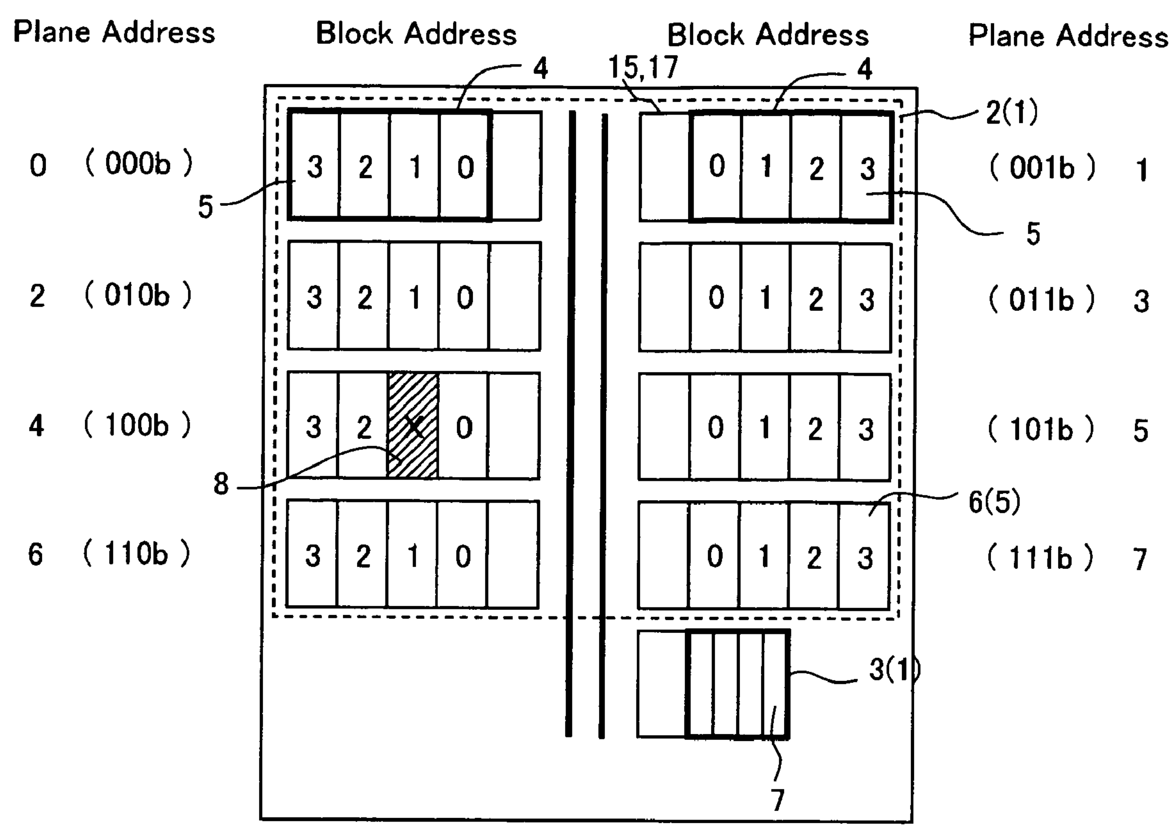
FIG. 8 is a block diagram schematically showing an example of a position of a defective block in the memory array constitution shown in FIG. 1.

A memory plane P2 containing the defective block (refer to a hatched part in FIG. 8) in the physical block address map is treated as a memory plane P7 in the logical block address map, and a memory plane P7 logically containing the boot block in the physical block address map is treated as a memory plane P2 in the logical block address map. Therefore, when "010" is inputted as the external block address (plane address), the memory plane P7 in an internal block address space (that is, in the actual memory array) is selected, while when "111" is inputted as the external block address (plane address), the memory plane P2 in the internal block address space is selected.

Each memory block in the memory plane is converted similarly by the address conversion process. Here, when the defective block address "01001" is inputted from the outside, the redundant block of the block address "11111" in the internal block address space is selected by the address conversion process and the defective block is replaced with the redundant block. As a result, the defective block is assisted by the redundant block. On the contrary, when the particular block address "11111" which selects the boot block part 3 is inputted from the outside, it is assumed that the defective block (refer to the hatched part in FIG. 8) of the block address "01001" in the internal block address space is selected by the address conversion process. However, if so, since the boot block part 3 is not correctly selected, when the particular block address "11111" is inputted, the boot block detection circuit 11 selects the boot block part 3 forcibly as described above.

When there is no defective block, since inversion by the exclusive NOR process is not performed at all by setting the defective block at "11111" which is the redundant block address, the external block address is outputted as it is as the internal block address.

According to this embodiment, since the redundant block address is "11111", the exclusive NOR process is performed. If the redundant block address is "00000", since the position of "1" of the address bit of the defective block address does not coincide with the redundant block address, the exclusive OR process is appropriate instead of the exclusive NOR process. However, in the case of the exclusive OR process, since the output of the exclusive NOR process is only inverted, the exclusive NOR circuit or the exclusive OR circuit may be appropriately used in the concrete circuit constitution.

Here, the defective block address storing circuit 12 which outputs each address bit of the defective block address to the address conversion circuit 10 can store the state (0 or 1) of each address bit by allocating a pair of flash cells to each address bit, setting one flash cell at a high-threshold voltage and the other flash cells at a low-threshold voltage, and determining which flash cell is programmed at the high-threshold voltage. In addition, the state of each address bit can be surely read at low current consumption by using the two flash cells to each address bit.

Alternatively, it may be so constituted that one flash memory is allocated to each address bit and a redundant block address is related to its erased state to program only the part which does not coincide. In this constitution, the use of the address conversion circuit 10 is not limited to the case where the redundant block address is "11111". In addition, when the address conversion circuit 10 basically uses the exclusive OR process, a flash cell may be programmed only at a position where the defective block address coincides with the redundant block address. In this constitution, when there is no defective block, it is not necessary to store the defective block address in the defective block address storing circuit 12 as a default.

In addition, it is preferable that the flash cell of the defective block address storing circuit 12 can be programmed, or programmed/erased from the outside in either of the above constitutions. In this case, a particular command is received from the outside and the defective block address storing circuit 12 is moved to a reprogramming mode to perform the erasing or programming operation for each flash cell, for example.

Figure 9:
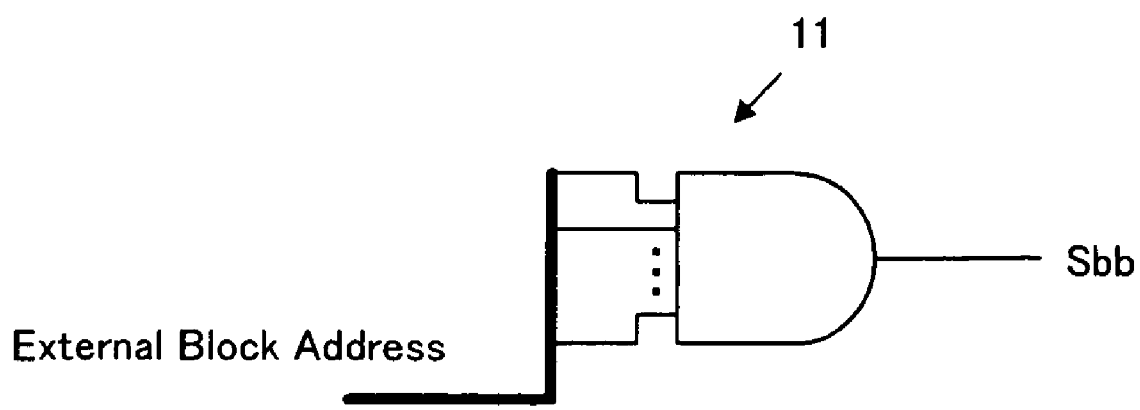
FIG. 9 is a logical circuit diagram showing an example of a boot block detection circuit according to one embodiment of the nonvolatile semiconductor memory device in the present invention.

Next, a description will be made of the boot block detection circuit 11 in brief According to this embodiment, since the particular block address is "11111", as shown in FIG. 9, the circuit comprises a simple 5-input AND circuit logically. Each address bit of the external block address is inputted to each input thereof. In addition, when the particular block address is "00000", the boot block detection circuit 11 comprises a simple 5-input NOR circuit logically on the basis of the similar theory.

Next, a description will be made of procedures in which the block redundancy assist process is performed, the defective block address is stored in the defective block address storing circuit 12, the address conversion circuit 10 is set so as to be able to replace the defective block with the redundant block and then the plurality of memory blocks are selected at the same time. In this case, when it is determined whether the defective block exists in any memory plane or not, it is determined that the defective block exists obviously.

In this case, when the plane address and the block address corresponding to the defective block is inputted from the outside, since they are converted to the redundant block address by the address conversion circuit 10, the particular block address which is the redundant block address is inputted from the outside. Therefore, the address conversion circuit 10 outputs the plane address and the block address corresponding to the defective block. In addition, at the same time as the address is inputted, the first plural block selection signal Smb1 is brought to the low level so that the block decoder circuit 14 can perform the normal decoding process, and the second plural block selection signal Smb2 is set at the high level.

Here, when the particular block address is inputted from the outside in the normal memory operation mode, although the boot block detection circuit 11 detects the input and outputs the high-level boot block selection signal Sbb, the boot block selection signal Sbb is fixed to the low level because the second plural block selection signal Smb2 is at the high level. Therefore, each memory plane of the memory array body part 2 is selected based on the plane selection signals PSEL0 to 7 which are normally decoded by the plane decoder circuit 13. Therefore, since the address conversion circuit 10 outputs the plane address and the block address corresponding to the defective block, the same process as the case where the above address conversion process is not performed is performed. Since the subsequent procedures are the same as described above, they will be omitted.

Next, another embodiment of the inventive device will be described.

(1) Although the block decoder circuit 14 is commonly provided for each memory plane 4 and its decoded signals, that is, the block selection signals BSEL0 to 3 are inputted to corresponding plane selection circuits 15 in the above embodiment, a block decoder circuit 14 may be provided in each plane selection circuit 15. In this case, an internal block address (lower 2 bits) which was converted by an address conversion circuit 10 is not decoded and directly inputted to each plane selection circuit 15.

Figure 10:
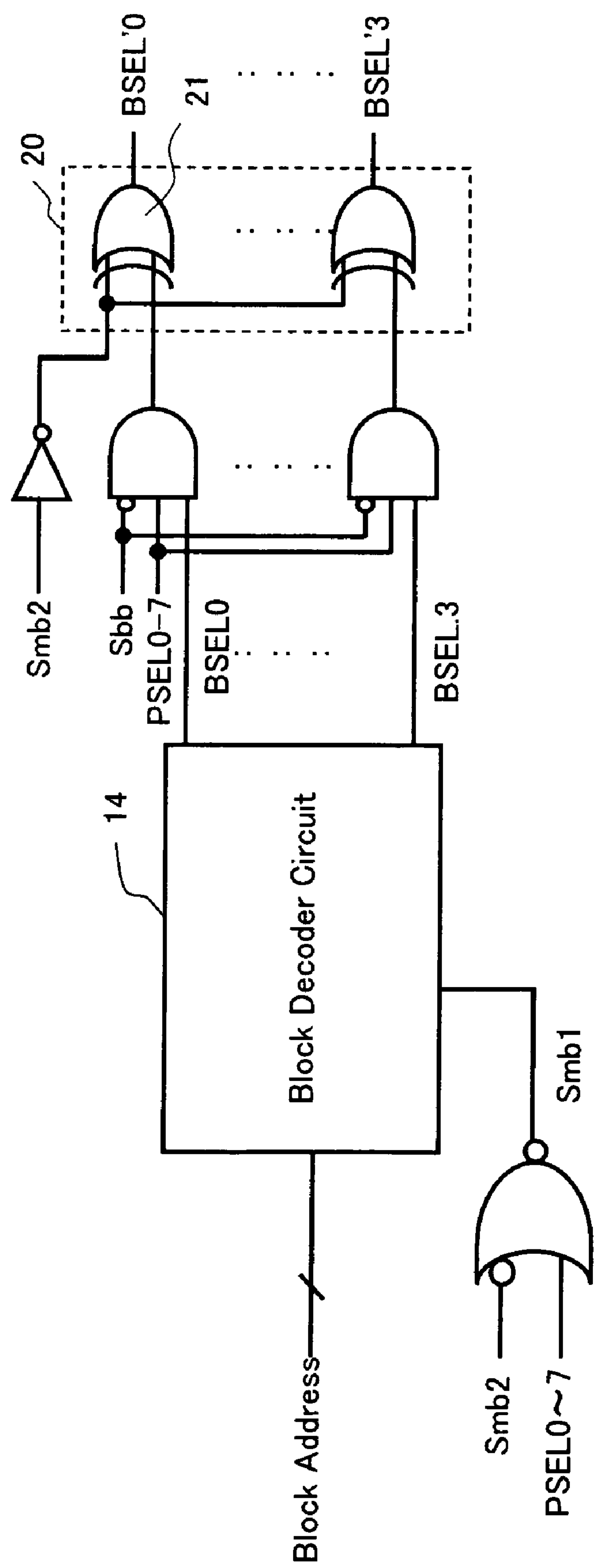
FIG. 10 is a logical circuit diagram showing a circuit constitution of a plane selection circuit regarding the process for selecting a plurality of blocks according to another embodiment of the nonvolatile semiconductor memory device in the present invention.

When the block decoder circuit 14 is locally provided in each memory plane, the block decoder circuit 14 can be separately controlled. That is, the same operation as the case the defective block is not contained in the above embodiment can be performed for a memory plane which does not contain the defective block. For example, as shown in FIG. 10, there is provided a constitution in which a first plural block selection signal Smb1 is set at a high level when a second plural block selection signal Smb2 is at the high level and the memory plane is not selected (plane selection signals PSEL0 to 7 are at a low level), by setting the first plural block selection signal Smb1 to be inputted to the block decoder circuit 14 so as to be NOR of the second plural block selection signal Smb2 NOR logic and the plane selection signals PSEL0 to 7. According to the circuit constitution shown in FIG. 10, since the second plural block selection signal Smb2 is at the low level during the normal memory operation, the first plural block selection signal Smb1 becomes the low level regardless of selected state or non-selected state of the memory planes and the block decoder circuit 14 carries out the normal decoding process. In addition, even when the second plural block selection signals Smb2 is at the high level, if the memory planes are in the selected state (the plane selection signals PSEL0 to 7 are at the high level), the first plural block selection signal Smb1 becomes the low level and the block decoder circuit 14 carries out the normal decoding process.

Therefore, for the non-selected memory planes which do not contain the defective block, the block selection signals BSEL0 to 3 are all in the non-selected state and the block selection signal inversion circuit 20 puts all of the inputted block selection signals BSEL0 to 3 internally in the selected state (high level). Therefore, the same process as the case the defective block is not contained in the above embodiment is carried out. In addition, for the selected memory plane which contains the defective block, since the normal decoding process is performed, the same process as for the selected memory plane containing the defective block in the above embodiment is performed.

Here, as still another embodiment, it is also preferable that a local block decoder circuit 14 puts all block selection signals BSEL0 to 3 in the selected state when the first plural block selection signal Smb1 is at a high level and the block selection signal inversion circuit 20 performs non-inversion process when a second plural block selection signal Smb2 is at the high level.

(2) Although it is assumed that the inventive device is the boot block-type flash memory in the above embodiment, the plurality of memory block selection process according to the present invention, that is, the inventive method effectively functions even when it is applied to an equivalent block-type flash memory in which a particular memory block is not a boot block.

(3) Although it is assumed that the particular block address is “11111” in the above embodiment, the particular block address is not limited to the most significant address of the block address, it may be the least significant address or may be the middle of them.

(4) Although the defective block address storing circuit 12 stores the defective block address in the above embodiment, when the particular block address is “11111” or “00000”, since it is substantially equivalent to a case where the position which the defective block address does not coincide with each address bit of the redundant block address or a position which the defective block address coincides with that are stored, the address bit at the position where the defective block address does not coincide with the redundant block address or the position where the defective block address coincide with the redundant block address may be stored.

(5) Although one memory array 1 which comprises the memory array body part 2 comprising one redundant block 7 and the boot block part 3 is described in the above embodiment, the plurality of memory arrays 1 may be provided.

(6) Although the flash cell is assumed as the memory cell in the above embodiment, the memory cell is not limited to that. In addition, the block replacement process of the present invention can be applied to the memory cell which is a variable resistive element such as MRAM, OUM, RRAM and the like other than the one in which a difference in storage state appears as a difference in threshold voltage of a memory transistor. Furthermore, the concept of the plurality of memory block selection processes of the present invention can be applied to another semiconductor memory device.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A semiconductor memory device comprising:

at least one memory plane in which a plurality of memory blocks comprising a plurality of memory cells in the form of an array are arranged;

a block decoder circuit which decodes a block address signal for selecting a memory block from the memory plane and outputs a block selection signal for selecting the memory block as well as puts all block selection signals in a selected state or a non-selected state and outputs them in a predetermined test mode; and a block selection signal inversion circuit which inverts or non-inverts a signal level of the block selection signal.

2. The semiconductor memory device according to claim 1, comprising:

a plane control circuit which has the block decoder circuit input a block address of a defective block and perform a normal decoding process, and controls the block selection signal inversion circuit to perform the inversion process when the defective block exists in the memory plane, and selects all of the memory blocks in the memory plane when the defective block does not exist in the memory plane, in the predetermined test mode.

3. The semiconductor memory device according to claim 2, wherein the plane control circuit controls the block decoder circuit to put all of the block selection signals in selected state and output them, and the block selection signal inversion circuit to perform the non-inversion process, or controls the block decoder circuit to put all of the block selection signals in the non-selected state and output them, and the block selection signal inversion circuit to perform the inversion process when a defective block does not exist in the memory plane.

4. The semiconductor memory device according to claim 2, comprising:

a memory array comprising a plurality of the memory planes; and a plane decoder circuit which decodes a plane address signal for selecting the memory plane from the memory array and outputs a plane selection signal for selecting the memory plane, wherein the plane control circuit selects all of the memory blocks in the memory plane which is not selected by the plane selection signal in the predetermined test mode.

5. The semiconductor memory device according to claim 1, comprising:

a redundant block having the same number of memory cells and the same constitution as in the memory block; and an address conversion circuit which performs an internal address replacement operation in which at least a defective block address is replaced with a redundant block address of the redundant block in order to replace a defective block with the redundant block when one memory block in the memory plane is the defective block, wherein the block decoder circuit receives the block address after converted in the address conversion circuit as an input.

6. A method of testing a semiconductor memory device comprising at least one memory plane in which a plurality of memory blocks comprising a plurality of memory cells in the form of an array are arranged, the method comprising:

a determination step of determining whether there is a defective memory block in the memory plane or not;

a first block selection step of inputting a defective block address of the defective memory block as a block address for selecting the memory block from the memory plane, inverting all decoding signals of the defective block address and supplying them to the memory plane containing the defective memory block, and selecting all of the memory blocks except for the defective memory block when it is determined that the defective memory block exists in the determination step; and an application step of applying a predetermined stress or voltage at the same time to all of the selected memory blocks in the memory plane.

7. The method of testing the semiconductor memory device according to claim 6, comprising:

a second block selection step of puffing all decoding signals of the block address in the selected state and supplying them to the memory plane, and selecting all of the memory blocks when it is determined that the defective memory block does not exist in the determination step.

8. A method of testing a semiconductor memory device comprising a plurality of memory planes in which a plurality of memory blocks comprising a plurality of memory cells in the form of an array are arranged, the method comprising:

a determination step of determining whether there is a defective memory block in the plurality of the memory planes;

a first plane selection step of inputting a defective plane address of the memory plane containing the defective memory block as a plane address for selecting the memory plane, putting the memory plane containing the defective memory block in a selected state and other memory planes in a non-selected state when it is determined that the defective memory block exists in the determination step;

a third block selection step of inputting the defective block address of the defective memory block as a block address for selecting the memory block from the memory plane, inverting all decoding signals of the defective block address and supplying them to the memory plane which is selected in the first plane selection step and selecting all of the memory blocks except for the defective memory block, and selecting all of the memory blocks in the memory plane which is not selected in the first plane selecting step, when it is determined that the defective memory block exists in the determination step; and an application step of applying a predetermined stress or voltage to all of the selected memory blocks in the plurality of memory planes at the same time.

9. The method of testing the semiconductor memory device according to claim 8, comprising:

a second plane selection step of inputting an arbitrary plane address as a plane address for selecting the memory plane, putting one of the plurality of memory planes in the selected state and other memory planes in the non-selected state when it is determined that the defective memory block does not exist in the determination step; and a fourth block selection step of putting all decoding signals of the block address in the selected state and supplying them to the memory plane which is selected in the second plane selection step, and selecting all of the memory blocks, and selecting all of the memory blocks in the memory plane which is not selected in the second plane selection step, when it is determined that the defective memory block does not exist in the determination step.

* * * * *